(12) United States Patent
Amador et al.

(10) Patent No.: US 6,926,150 B2
(45) Date of Patent: Aug. 9, 2005

(54) PROTECTIVE INTERLEAF FOR STACKED WAFER SHIPPING

(75) Inventors: Gonzalo Amador, Dallas, TX (US); Sandra Rodriguez, El Paso, TX (US)

(73) Assignee: Texas Instruments Incorporated, Dallas, TX (US)

(*) Notice: Subject to any disclaimer, the term of this patent is extended or adjusted under 35 U.S.C. 154(b) by 71 days.

(21) Appl. No.: 10/417,499

(22) Filed: Apr. 17, 2003

(65) Prior Publication Data

US 2004/0149623 A1 Aug. 5, 2004

Related U.S. Application Data

(60) Provisional application No. 60/445,110, filed on Feb. 5, 2003.

(51) Int. Cl.$^7$ ................................ B65D 85/30
(52) U.S. Cl. .................. 206/710; 206/303; 206/499; 206/718
(58) Field of Search .............. 206/710, 718, 206/453–454, 303, 499, 585, 593

(56) References Cited

U.S. PATENT DOCUMENTS

| | | | | |
|---|---|---|---|---|
| 4,787,508 A | * | 11/1988 | Wu et al. ................ | 206/445 |
| 4,792,044 A | * | 12/1988 | Nishizawa et al. ...... | 206/394 |
| 5,699,916 A | * | 12/1997 | Liang ...................... | 206/710 |
| 6,533,123 B1 | * | 3/2003 | Nakamura et al. ...... | 206/710 |

* cited by examiner

Primary Examiner—Bryon P. Gehman
(74) Attorney, Agent, or Firm—Yingsheng Tung; Wade James Brady, III; Frederick J. Telecky, Jr.

(57) ABSTRACT

A package includes a first and a second wafer stored therein in a stacked configuration. The first wafer has interconnection conductor material portions extending from a first surface thereof. The interconnection conductor material portions have a maximum height. An interleaf member is located between the first and second wafers. A first recessed portion is formed in the interleaf member, and it has an outer perimeter shape corresponding to an outer perimeter shape of the first wafer. The first recessed portion has a first depth from a top surface of the interleaf member. A second recessed portion is formed in the interleaf member and located at least partially within the first recessed portion, and it has a bottom surface at a second depth from the top surface. The second depth is greater than the first depth. The second depth minus the first depth is greater than the maximum height.

9 Claims, 4 Drawing Sheets

PROTECTIVE INTERLEAF FOR STACKED WAFER SHIPPING

This application claims the priority benefit of commonly owned U.S. Provisional Patent Application having Ser. No. 60/445,110 entitled PROTECTIVE INTERLEAF FOR STACKED WAFER SHIPPING filed on Feb. 5, 2003, which is hereby incorporated by reference.

TECHNICAL FIELD

The present invention generally relates to wafer carriers or packages used for shipping semiconductor wafers. In one aspect, it relates to a protective interleaf for use between stacked wafers during shipping of the wafers.

BACKGROUND

Some manufacturers produce semiconductor wafers at one geographical location and have the wafers further processed at another geographical location. Also, some manufacturers ship large quantities of packaged wafers to other geographical locations. In such cases, the wafers are often delivered in a container filled with wafers in a horizontally stacked configuration. Such containers are sometimes referred to as coin stack boxes.

Many wafers have interconnection conductor material portions (e.g., solder bumps, bond pads, post-passivation interconnects) protruding from the wafer surface. There have been problems with the interconnection conductor material portions being damaged when shipped in coin stack boxes in a horizontally stacked configuration. The damage often occurs when the surface of one wafer is in contact with the back side of a wafer above it. Currently, a 2–3 mil thick sheet of antistatic film is placed between stacked wafers. But even with a wafer separator sheet between the wafers, the damage often still occurs. Scratches may occur on wafer surfaces due to particles or contamination on the antistatic film. During shipping, the interconnection conductor material portions may experience sheer forces (e.g., from one wafer rotating and/or shifting relative to another wafer). Such sheer forces tend to smear and/or shear some of the interconnection conductor material portions. Also, the interconnection conductor material portions are often flattened during shipping. Because the interconnection conductor material portions are often grouped very close together, such smearing and/or flattening may cause adjacent interconnection conductor material portions to be electrically connected, which is highly undesirable. Also, a sheared interconnection conductor material portion often acts as a disconnect or a resistor that will quickly burn through during normal current flows, which is also highly undesirable. Hence, there is a need for a way to ship horizontally stacked wafers while not damaging the interconnection conductor material portions extending from the wafers.

An experiment has shown that shipping wafers in a vertically position using existing vender boxes results in little or no damage to the interconnection conductor material portions extending from wafers. However, shipping the wafers in a vertically stacked and separated configuration can be more expensive than shipping them in a horizontally stacked configuration, as it may require a larger volume of space when shipping. Also, some manufacturers already have large investments in wafer carrier containers adapted for containing horizontally stacked wafers therein. Thus, it would be highly desirable to enable a way to use the existing wafer carrier containers for horizontal stacking, while preventing damage to the interconnection conductor material portions extending from the wafers during shipping.

BRIEF SUMMARY OF THE INVENTION

The problems and needs outlined above are addressed by certain aspects of the present invention. In accordance with one aspect of the present invention, a wafer-containing package is provided, which includes a first and a second wafer stored therein in a stacked configuration and an interleaf member. The first wafer has interconnection conductor material portions extending from a first surface thereof. The interconnection conductor material portions have a maximum height. The interleaf member is located between the first and second wafers such that the first surface of the first wafer is facing the interleaf member. The interleaf member includes a top surface, a first recessed portion, and a second recessed portion. The first recessed portion is formed in the interleaf member. The first recessed portion has an outer perimeter shape corresponding to an outer perimeter shape of the first wafer. The first recessed portion has a first depth from the top surface. The second recessed portion is formed in the interleaf member and located at least partially within the first recessed portion. The second recessed portion has a bottom surface at a second depth from the top surface. The second depth is greater than the first depth. The second depth minus the first depth is greater than the maximum height of the interconnection conductor material portions. The first depth may be less than, greater than, or approximately equal to a thickness of the first wafer. The interleaf member preferably has a hole formed through a central portion thereof. The hole may have a round shape. The outer perimeter shape of the interleaf member may be round. The outer perimeter shape of the first wafer may be round, and correspondingly, the outer perimeter shape of the first recessed portion may be round also. Furthermore, the second recessed portion may have a round outer perimeter shape. The bottom surface of the second recessed portion may have flat areas for engaging vacuum cups used in retaining the interleaf member. A transition between the first recessed portion and the top surface may have a chamfer. The chamfer may have any angle. Preferably, the chamfer has an angle of about 75 degrees relative to the top surface. The second wafer may also have interconnection conductor material portions extending therefrom. The package may also include additional wafers having interconnection conductor material portions extending therefrom, where the additional wafers are stacked with the first and second wafers in the package. Accordingly, additional interleaf members may be located between the additional wafers. The wafers may have a diameter greater than or equal to approximately 200 mm, or greater than or equal to approximately 300 mm, for example.

In accordance with another aspect of the present invention, an interleaf member is provided. The interleaf member is adapted to be placed between a first wafer and a second wafer within a container. The first wafer has interconnection conductor material portions extending from a first surface thereof. The interconnection conductor material portions have a maximum height. The interleaf member includes a top surface, a first recessed portion, and a second recessed portion. The first recessed portion is formed in the interleaf member. The first recessed portion has an outer perimeter shape corresponding to an outer perimeter shape of the first wafer. The first recessed portion has a first depth from the top surface. The second recessed portion is formed in the interleaf member and located at least partially within the first recessed portion. The second recessed portion has a bottom surface at a second depth from the top surface. The second depth is greater than the first depth. The second depth minus the first depth is greater than the maximum height of the interconnection conductor material portions.

In accordance with yet another aspect of the present invention, a package is provided, which includes a first and a second wafer stored therein in a stacked configuration and an interleaf member. The first wafer has a diameter greater than or equal to approximately 200 mm. The first wafer has a round outer perimeter shape. The first wafer has solder bumps extending from a first surface thereof. The solder bumps have a maximum height. The interleaf member is located between the first and second wafers such that the first surface of the first wafer is facing the interleaf member. The interleaf member includes a top surface, a first recessed portion, and a second recessed portion. The first recessed portion is formed in the interleaf member. The first recessed portion has a round outer perimeter shape corresponding to the shape of the first wafer. The first recessed portion has a first depth from the top surface. The second recessed portion is formed in the interleaf member and located within the first recessed portion. The second recessed portion has a bottom surface at a second depth from the top surface. The bottom surface has flat areas for engaging vacuum cups used in retaining the interleaf member for handling, loading, and unloading of the interleaf members. The second depth is greater than the first depth. The second depth minus the first depth is greater than the maximum height of the solder bumps. The interleaf member has a round hole formed through a central portion thereof. The hole is located within the second recessed portion.

BRIEF DESCRIPTION OF THE DRAWINGS

The above features of the present invention will be more clearly understood from consideration of the following descriptions in connection with accompanying drawings in which.

DETAILED DESCRIPTION OF PREFERRED EMBODIMENTS

Figure 1:
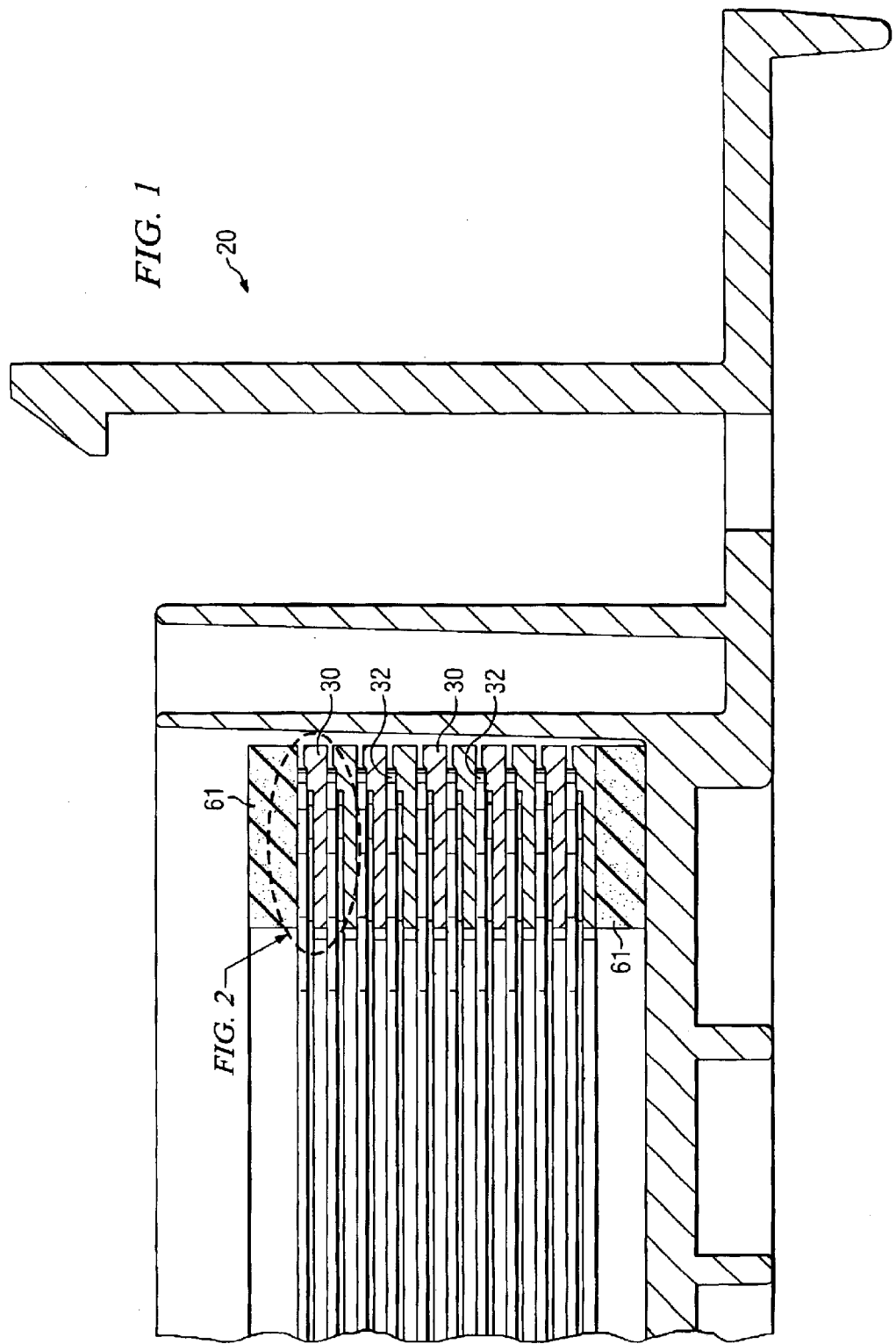
FIG. 1 is a side cross-section view of a package in accordance with a first embodiment of the present invention.

Referring now to the drawings, wherein like reference numbers are used herein to designate like elements throughout the various views, preferred embodiments of the present invention are illustrated and described. As will be understood by one of ordinary skill in the art, the figures are not necessarily drawn to scale, and in some instances the drawings have been exaggerated and/or simplified in places for illustrative purposes only. One of ordinary skill in the art will appreciate the many applications and variations of the present invention in light of the following description of the preferred embodiments of the present invention. The preferred embodiments discussed herein are illustrative examples of the present invention and do not limit the scope of the invention to the preferred embodiments described.

Generally, an embodiment of the present invention provides a way to protect interconnection conductor material portions extending from a wafer surface from being damaged while the wafer is being shipped in a horizontally stacked configuration. The phrase "interconnection conductor material portions" as used herein refers to any feature extending from a surface of a wafer that may be damaged from compaction or sheer forces or particle scratching during shipping and handling, including (but not necessarily limited to): bond pads, solder bumps, solder balls, post passivation interconnects, conductor lines, or any combination thereof, for example. One of ordinary skill in the art will realize that there are many different wafer designs and configurations having interconnection conductor material portions extending from a wafer surface which may be used in conjunction with an embodiment of the present invention.

As wafer sizes increase, often the number of chips per wafer also increases. Many chip manufacturers are using wafers that are about 200 mm in diameter, for example. Also, some chip manufacturers are beginning to use wafers that are greater than or equal to about 300 mm in diameter. As the number of chips per wafer increases, it is becoming more important to protect each wafer from being damaged or flawed. Hence, it is becoming more economically feasible to allot more funds to the protection of each wafer during shipping. Thus, even though it is likely more expensive to provide a protective interleaf member (e.g., in accordance with the present invention) between wafers than simply using a thin film, the extra cost of protecting each wafer may be justified due to a larger number of chips per wafer.

Also, as the size of the wafers increase, the weight of each wafer increases, which poses problems needing new solutions, such as an embodiment of the present invention. Furthermore, the inherent value of these die after having been through the entire fabrication process, including testing, is increasing in some instances. Such increases in value may be attributed to the complexity of die and size of die. Hence, the loss of a single die may be a significant cost. Therefore, the added cost of a shipping interleaf member is often justified for these reasons. A further advantage of an embodiment of the present invention over the use of thin film separators is that the protective interleafs may be used many times without losing functionality, whereas a thin film may not.

Figure 2:
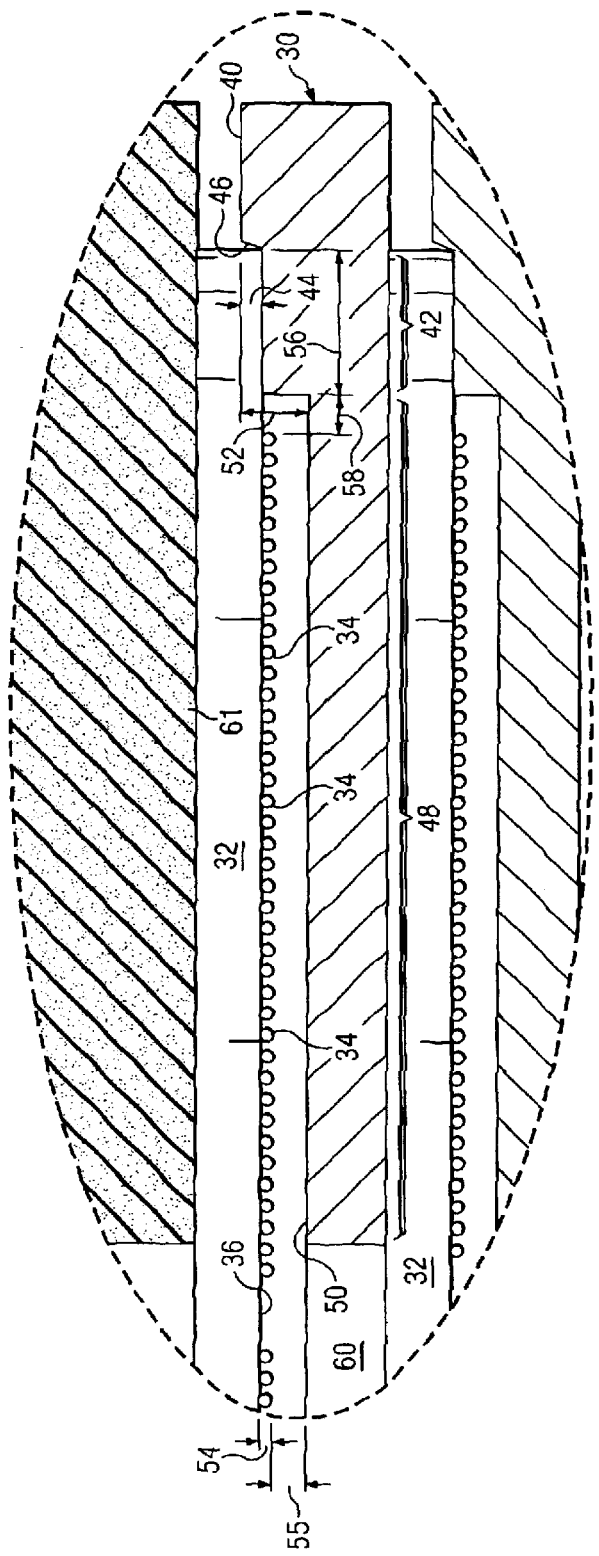
FIG. 2 is an enlarged view of a portion of the package of FIG. 1.
Figure 3:
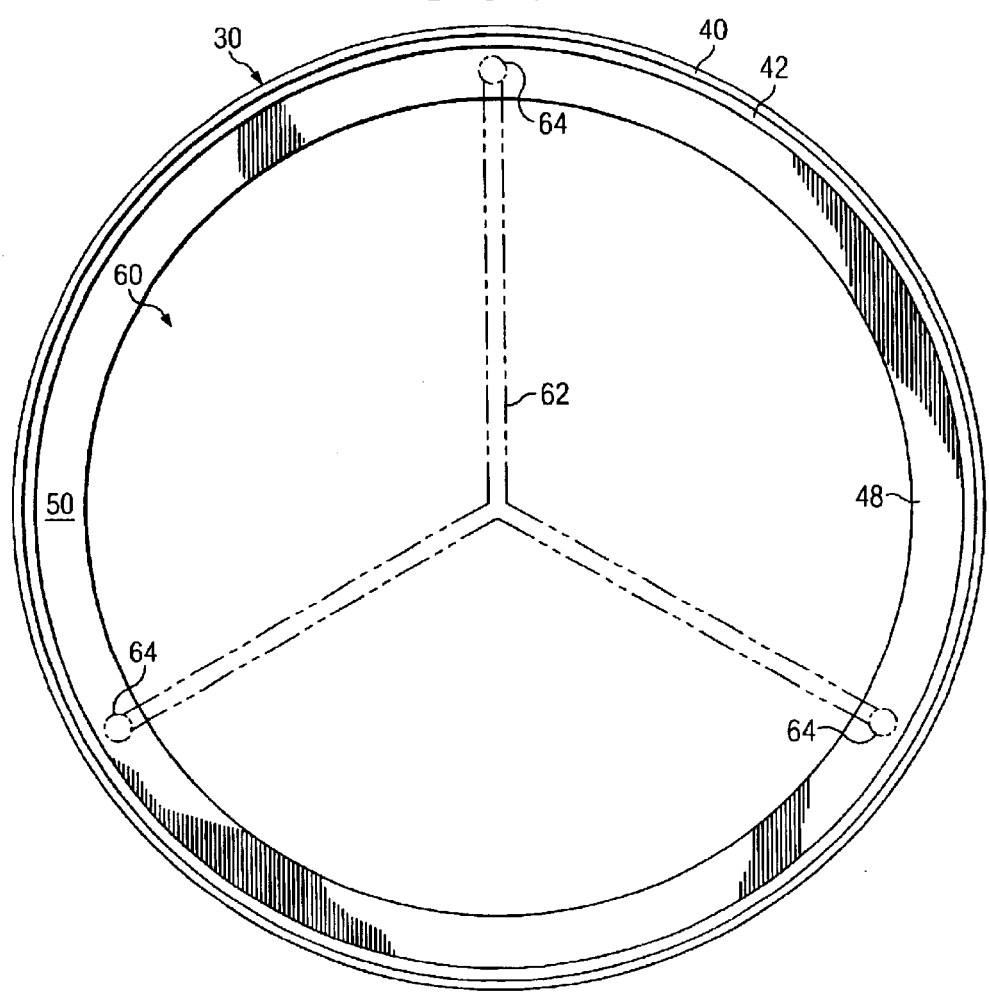
FIG. 3 is a top view of a protective interleaf member of the first embodiment.

A first embodiment of the present invention is shown in FIGS. 1–3. FIG. 1 is a side cross-section view of a package 20 of the first embodiment. FIG. 2 is an enlarged view of a portion of the package 20 of FIG. 1. FIG. 3 is a top view of a protective interleaf member 30 of the first embodiment.

In FIG. 1, the package 20 (also sometimes referred to as a coin stack box) has wafers 32 horizontally stacked therein. In this example, each wafer 32 has solder bumps 34 extending from a surface 36 of the wafer 32, which are shown in FIG. 1 but can be better seen in FIG. 2. The interleaf members 30 are located between the wafers 32. One of the purposes of the interleaf members 30 is to prevent or reduce damage to the bumps 34 during shipping of such wafers 32 in a horizontally stacked configuration.

The interleaf member 30 of the first embodiment is made from semi-rigid antistatic plastic material, which is preferred. Conductive polypropylene (PP) is a preferred choice for the semi-rigid antistatic plastic material, but other conductive plastics/materials may work also. Furthermore, other materials may be used for the interleaf member 30 in other embodiments.

Referring to FIG. 2, the interleaf member 30 of the first embodiment has a top surface 40. A first recessed portion 42 is formed in the interleaf member 30. As shown in FIG. 3, the first recessed portion 42 has an outer perimeter shape corresponding to an outer perimeter shape of the wafers 32 it is adapted to retain. Wafers typically have a round outer perimeter shape with one or more flat portions or notch(es). Also, the outer perimeter shape of the interleaf member 30 is round in this case (see e.g., FIG. 3), which matches the interior shape of the coin stack package 20. However, the interior shape of the package 20 and/or the outer perimeter shape of the interleaf member 30 may have any of a variety of shapes, including (but not limited to): round, rounded, square, rectangular, hexagonal, or octagonal, for example. The outer perimeter shape of the interleaf member 30 need not correspond to the outer perimeter shape of the first recessed portion.

As shown in FIG. 2, the first recessed portion 42 has a first depth 44 from the top surface 40. The thickness of this first depth 44 may vary for different embodiments. In the first embodiment shown in FIG. 2, the first depth 44 is less than a thickness of the wafer 32. In other embodiments (not shown), however, the first depth 44 may be equal to or greater than the thickness of a wafer 32 retained therein. Also in the first embodiment, the transition between the top surface 40 and the first recessed portion 42 has a chamfer 46. The chamfer 46 is a preferred feature to aid in the insertion and extraction of the wafer 32 into and out of the interleaf member 30. However, the chamfer 46 is an optional feature (see e.g., second embodiment below). The chamfer 46 may also allow for a variance in the outer diameter size of wafers 32 that may be retained by a given interleaf member 30. Furthermore, the chamfer 46 may help to ensure that the outer edges of the wafer 32 remain in contact with the interleaf member 30 at all times so that the wafer 32 does not freely slide horizontally within the interleaf member 30 during shipping and handling. Furthermore, the chamfer 46 may help center the wafer 32 within the interleaf member 30.

In the first embodiment, the chamfer 46 has an angle of about 75 degrees relative to the top surface 40 of the interleaf member 30. However, the chamfer 46 may have any angle relative to the top surface 40 in other embodiments (not shown). In some embodiments the outer perimeter of the first recessed portion 42 may be larger than the outer diameter of a wafer 32 therein to account for manufacturing tolerances of wafers and interleaf protective member, and to prevent wafers sticking in the interleaf members or breaking due to stresses imparted on the wafer. The wafers may be free to move slightly within the bounds of the first recessed portion 42 with a predetermined clearance.

As shown in FIG. 2, a second recessed portion 48 is formed in the interleaf member 30 within the first recessed portion 42. The second recessed portion 48 has a bottom surface 50 located at a second depth 52 from the top surface 40 of the interleaf member 30. The second depth 52 is greater than the first depth 44. For a given wafer design, there is typically a maximum height specification for the solder bumps 34 extending therefrom. Usually, the solder bumps 34 are all approximately the same height. The second depth 52 minus the first depth 44 is greater than the maximum height 54 of the solder bumps 34. Hence, the second recessed portion 48 provides clearance 55 between the bottom surface 50 of the second recessed portion 48 and the bumps 34 so that preferably the bumps 34 do not contact anything during shipping and handling. The radial width 56 of the first recessed portion 42 is also designed to provide a radial clearance 58 between the first recessed portion 42 and the bumps 34. The radial width 56 and the radial clearance 58 may vary for different embodiments (not shown).

As shown in FIG. 3, the second recessed portion 48 in this embodiment has a round outer perimeter shape, which is preferred. In the first embodiment, the interleaf member 30 has a round hole 60 formed within the second recessed portion 48. In other embodiments (not shown), there may not be a hole 60 formed through the interleaf member 30 (e.g., bottom surface 50 of second recessed portion 48 extending to the center of the interleaf member 30). It is preferred to have a hole 60 in the center of the interleaf member 30 because the material of the interleaf member 30 will sometimes warp or bow, especially at thin portions of the interleaf member 30. If the interleaf member 30 is warped or bowed, the interleaf member 30 may contact the bumps 34 during shipping and handling of the wafer, which is typically undesirable (as discussed in the Background section above). The shape of the hole 60 may vary as well (e.g., round, square, triangular, etc.), and need not correspond to the shape of other portions of the interleaf member 30.

In FIG. 1, the foam 61 on the bottom preferably has a hole in its center as well to roughly correspond with the hole 60 in the interleaf member 30. If not, the foam 61 may bow up and touch the bottom most wafer 32. Also, the top foam 61 preferably have the hole so that no downward forces are applied to the center of the top most wafer 32 via the foam 61, which might cause the wafer 32 to bow.

Referring to FIG. 3, note that in the first embodiment, the outer perimeter shape of the first recessed portion 42 has a round shape, even though most wafers 32 are round with one or more flat sides or notch(es). In other embodiments (not shown), the first recessed portion 42 may have exactly the same shape as a given wafer 32 (e.g., round with a flat side). Also, in other embodiments (not shown) the first recessed portion 42 may have a notch or portion (not shown) extending radially beyond the major outer perimeter shape of the first recessed portion 42 for allowing access to an outer edge of the wafer 32 while it is within the first recessed portion 42 (e.g., for grabbing the outer edge of the wafer 32).

In the first embodiment, the second recessed portion 48 is completely within the first recessed portion 42. However, in other embodiments (not shown), the second recessed portion 48 may have portions extending radially outside of the first recessed portion 42, for example. In FIG. 3, a phantom line showing of an example robotic arm extension 62 having vacuum cups 64 at its tips is shown. Preferably, the bottom surface 50 of the second recessed portion 48 has flat areas where such vacuum cups 64 may engage and retain the interleaf member 30. Hence, in the first embodiment, a same robotic arm with vacuum cups at its tips that is normally used to pick up, retain, and move a wafer 32 may also be used to pick up, retain, and move the interleaf member 30. Thus, it is preferably to have the flat areas on the interleaf member 30 at radial locations corresponding to radial locations on a wafer 32 where an existing wafer mover engages the wafer 32 for movement of the wafer 32. Therefore, this is one of the advantages of providing a larger bottom surface 50 of the second recessed portion 48. However, in other embodiments, the interleaf member may not have large enough flat areas for engaging vacuum cups or the flat areas may be located at other portions (e.g., at the first recessed portion 42, or at the top surface 40).

Preferably, the entire bottom surface 50 is flat so the vacuum cups 64 can engage the interleaf member 30 irrespective of its angle of rotation. Also preferable, the wafer 32 can sit in the interleaf member 30 at any rotational angle when there are no locating details for a flat or notch within the first recessed portion 42. By designing the interleaf members 30 so that the angular orientation of the interleaf member 30 relative its adjacent wafers 32 is not relevant during use, automating the loading and unloading of wafers 32 and interleaf members 30 is made easier.

Figure 5:
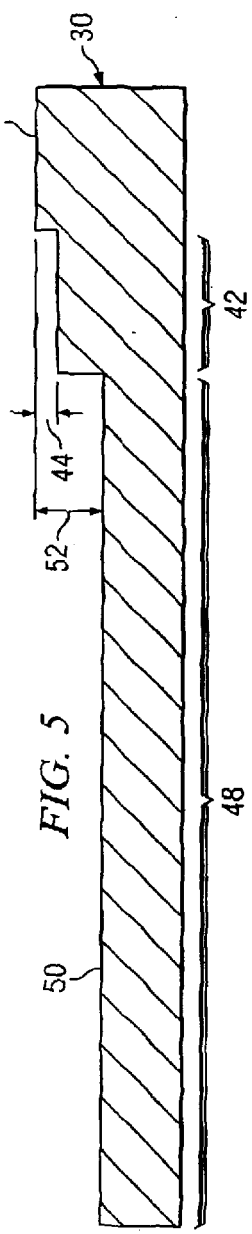
FIG. 5 is a cross-section view of the interleaf member of the second embodiment as taken along line 5—5 in FIG. 4.
Figure 4:
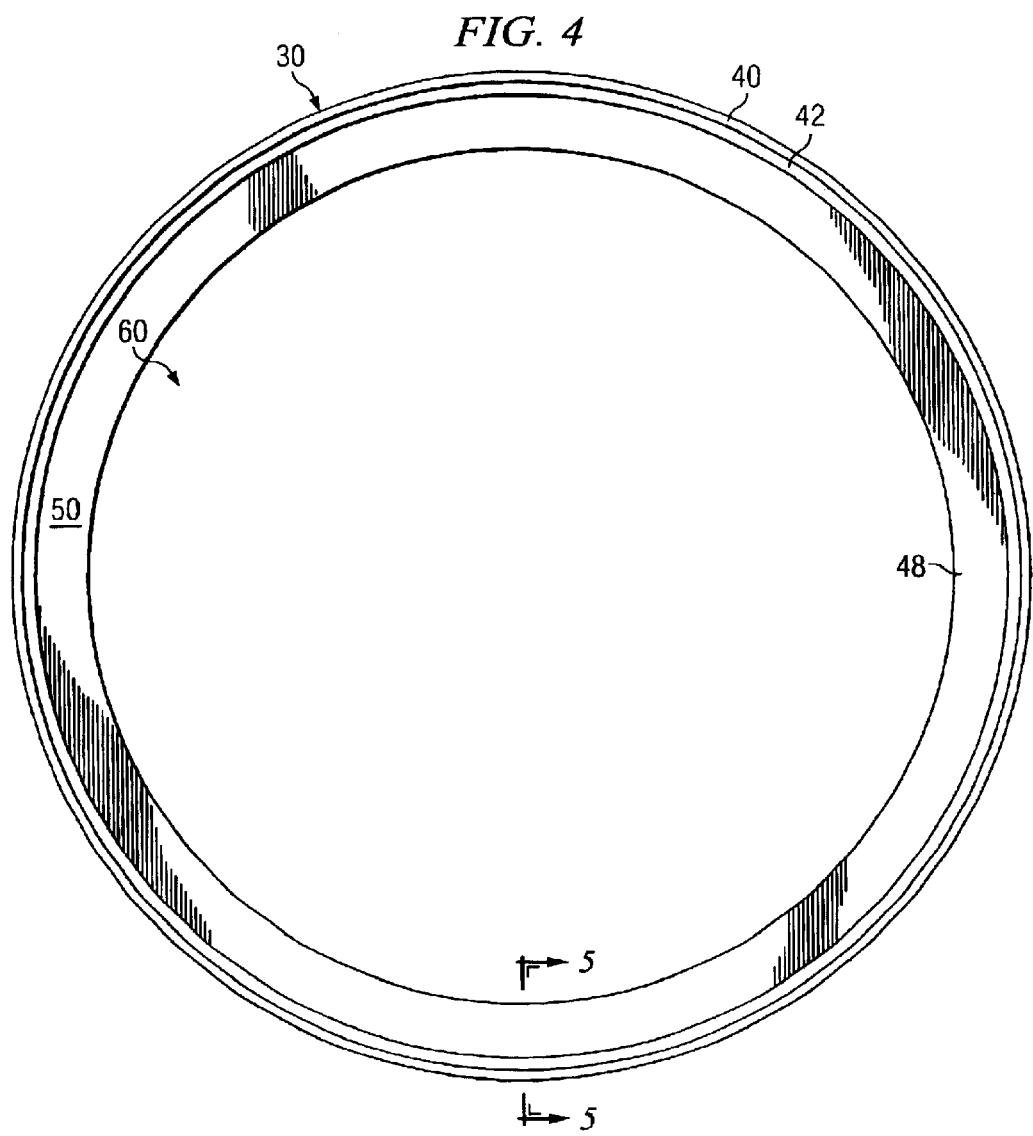
FIG. 4 is a top view of the interleaf member in accordance with a second embodiment of the present invention.

FIGS. 4 and 5 show an interleaf member 30 in accordance with a second embodiment of the present invention. FIG. 4 is a top view of the interleaf member 30. FIG. 5 is a cross-section view of the interleaf member 30 as taken along line 5—5 in FIG. 4. The second embodiment is essentially the same as the first embodiment described above, except that there is no chamfer 46 at the transition between the first recessed portion 42 and the top surface 40 (see FIG. 5).

It will be appreciated by those skilled in the art having the benefit of this disclosure that an embodiment of the present invention provides a way to protect the interconnection conductor material portions on a wafer from damage while the wafer is being shipped in a horizontally stacked configuration. It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Thus, it is intended that the following claims be interpreted to embrace all such further modifications, changes, rearrangements, substitutions, alternatives, design choices, and embodiments.

What is claimed is:

1. A wafer-containing package, comprising:

a first wafer and a second wafer stored therein in a stacked configuration, the first wafer having interconnection conductor material portions extending from a first surface thereof, wherein the interconnection conductor material portions have a maximum height;

an interleaf member located between the first and second wafers such that the first surface of the first wafer is facing the interleaf member, the interleaf member comprising:

a top surface, a first recessed portion formed in the interleaf member, the first recessed portion having an outer perimeter shape corresponding to an outer perimeter shape of the first wafer, and the first recessed portion having a first depth from the top surface, and a second recessed portion formed in the interleaf member and located at least partially within the first recessed portion, the second recessed portion having a bottom surface at a second depth from the top surface, wherein the second depth is greater than the first depth, and wherein the second depth minus the first depth is greater than the maximum height of the interconnection conductor material portions.

2. The package of claim 1, wherein the interconnection conductor material portions extending from the first surface include at least one of bond pads, solder bumps, solder balls, post passivation interconnects, and conductor lines.

3. The package of claim 1, further comprising:

additional wafers having interconnection conductor material portions extending therefrom, the additional wafers being stacked with the first and second wafers; and additional interleaf members located between the additional wafers.

4. The wafer-containing package of claim 1, in which the bottom surface has a flat area for engaging a vacuum cup.

5. The wafer-containing package of claim 1, further comprising a chamfer between the first recessed portion and the top surface.

6. The wafer-containing package of claim 5, in which the chamfer has an angle of about 75 degrees relative to the top surface.

7. The wafer-containing package of claim 1, in which the first wafer has a diameter greater than or equal to approximately 200 mm.

8. A wafer-containing package, comprising:

a first wafer and a second wafer stored therein in a stacked configuration, the first wafer having a diameter greater than or equal to approximately 300 mm, and the first wafer having interconnection conductor material portions extending from a first surface thereof, wherein the interconnection conductor material portions have a maximum height;

an interleaf member located between the first and second wafers such that the first surface of the first wafer is facing the interleaf member, the interleaf member comprising:

a top surface, a first recessed portion formed in the interleaf member, the first recessed portion having an outer perimeter shape corresponding to an outer perimeter shape of the first wafer, and the first recessed portion having a first depth from the top surface, and a second recessed portion formed in the interleaf member and located at least partially within the first recessed portion, the second recessed portion having a bottom surface at a second depth from the top surface, wherein the second depth is greater than the first depth, and wherein the second depth minus the first depth is greater than the maximum height of the interconnection conductor material portions.

9. The package of claim 8, wherein the interconnection conductor material portions extending from the first surface include at least one of bond pads, solder bumps, solder balls, post passivation interconnects, and conductor lines.

* * * * *